(12) United States Patent
Takayama et al.

(10) Patent No.: US 6,348,702 B1
(45) Date of Patent: Feb. 19, 2002

(54) IMAGE DISPLAY SYSTEM

(75) Inventors: Ichirou Takayama, Ibaraki; Michio Arai, Tokyo, both of (JP)

(73) Assignees: TDK Corporation, Tokyo; Semiconductor Energy Lab Co., Ltd., Atsugi, both of (JP)

( * ) Notice: Subject to any disclaimer, the term of this patent is extended or adjusted under 35 U.S.C. 154(b) by 0 days.

(21) Appl. No.: 09/241,732

(22) Filed: Feb. 2, 1999

(30) Foreign Application Priority Data

Feb. 2, 1998 (JP) .......................................... 10-020566

(51) Int. Cl.$^7$ ................... H01L 29/786; H01L 31/0368
(52) U.S. Cl. ............................ 257/72; 257/66; 257/88; 349/43
(58) Field of Search ............................ 257/66, 72, 88; 315/169.3; 345/205, 45; 349/43

(56) References Cited

U.S. PATENT DOCUMENTS

| | | | | |
|---|---|---|---|---|
| 3,564,135 A | * | 2/1971 | Weimer | 257/88 |
| 5,442,198 A | * | 8/1995 | Arai | 257/72 |
| 5,684,365 A | * | 11/1997 | Tang | 315/169.3 |
| 5,771,110 A | * | 6/1998 | Hirano | 257/72 |
| 5,959,312 A | * | 9/1999 | Tsai | 257/72 |
| 6,111,361 A | * | 8/2000 | Xu | 257/88 |

OTHER PUBLICATIONS

"A 6 x 6–in 20–lpi Electroluminescent Display Panel", Brody et al, *IEEE Transactions on Electron Devices*, vol. ED–22, No. 9, Sep. 1975, pp. 739–748.

"High–Performance Thin–Film Transistors in Large Grain Size Polysilicon Deposited by Thermal Decomposition of Disilane", Kouvatsos et al, *IEEE Transactions on Electron Devices*, vol. 43, No. 9, Sep. 1996, pp. 1399–1406.

* cited by examiner

*Primary Examiner*—Jerome Jackson, Jr.
(74) *Attorney, Agent, or Firm*—Arent Fox Kintner Plotkin & Kahn, PLLC

(57) ABSTRACT

In an image display system using an organic EL element, variation of light intensity of pixels on a display panel due to variation of characteristics of a bias transistor for energizing said EL element is improved. An active layer of said bias transistor is formed by polysilicon, and length and width of a gate of said transistor is at least 10 times as large as average diameter of a crystal grain of polysilicon in said active layer.

4 Claims, 10 Drawing Sheets

IMAGE DISPLAY SYSTEM

BACKGROUND OF THE INVENTION

The present invention relates to an image display system, in particular, relates to a high quality image display system which is used in an organic EL (Electro Luminescence) display panel.

In recent years, an image display panel using an organic EL (Electro Luminescence) element has been developed. When an organic EL panel which has a large number of organic EL elements is activated by using an active matrix circuit, a pixel of each EL is coupled with an FET (Field Effect Transistor) which is implemented by a TFT (Thin Film Transistor) for controlling supply current to each pixel. Therefore, each pixel is associated with a first TFT which biases an organic EL element to allow current to flow in said organic EL element, and a second TFT transistor for switching said first TFT transistor.

FIG. 9 shows a circuit diagram of a prior active matrix type organic EL display panel. The organic EL display panel comprises first signal lines in X-direction 301-1, 301-2, et al, second signal lines in Y-direction 302-1, 302-2, et al, power supply (Vdd) lines 303-1, 303-2, et al, switching transistors (TFT) 304-1, 304-2, et al, bias transistors (TFT) 305-1, 305-2, et al for controlling bias current in an EL element, organic EL elements 306-1, 306-2, et al, capacitors 307-1, 307-2, et al, a drive circuit in X-direction 308, and a drive circuit in Y-direction 309.

A pixel is selected by an X-direction signal line 301, and a Y-direction signal line 302, and the switching TFT transistor 304 associated with the selected pixel is turned ON so that the capacitor 307 associated with the selected pixel holds image data. Therefore, the bias TFT transistor 305 is turned ON, then, the organic EL element 306 is supplied with bias current associated with image data from a power supply line 303 so that the organic EL element 306 emits light.

When a signal line 301-1 in X-direction receives a signal associated with image data, and a signal line 302-1 receives a scanning signal in Y-direction, a switching TFT transistor 304-1 which is selected by said signal lines 301-1 and 302-1 is turned ON, then, a bias TFT transistor 305-1 is turned ON by a signal associated with image data, so that the selected EL element 306-1 is supplied bias current, and said EL element 306-1 emits light.

Therefore, each pixel of active matrix type EL display panel comprises a thin film type EL element, a bias TFT transistor for controlling light emit of said EL element, a signal hold capacitor coupled with a gate electrode of said bias TFT transistor, and a switching TFT transistor for writing data in said capacitor. The light intensity of each EL element depends upon current flowing in a bias TFT transistor, and said current depends upon voltage charged in a signal hold capacitor. This is described in (A66-in 201 pi Electro luminescent Display T. P. Brody, F. C. Luo, et al., IEEE Trans. Electron Devices, Vol. ED-22, No.9, Sep. 1975, pages 739–749).

The capacitance of a signal hold capacitor must be small so that a switching TFT transistor can charge the capacitor in a short selected time, and simultaneously, must be large so that the voltage across the capacitor does not decrease by the leak current through switching transistors which are not selected thereby for keeping excellent image quality until the next selection of a pixel.

By the way, an active matrix type display panel is requested having the size larger than 4 inches because of visibility when no optical enlarge system is used. A silicon single crystal substrate is impossible to implement that size of panel, because of high cost, since each sheet of single crystal Si substrate can provide very small number of panels under the current producing technology.

Therefore, it is preferable that an active matrix type display panel is comprised of a thin film transistor (TFT) by a non-single crystal Si semiconductor produced on a plane substrate, such as a glass substrate.

As for a non-single crystal semiconductor element on a plane substrate, an amorphous silicon layer has been used because large area of panel is easily obtained. However, a TFT transistor produced in an amorphous silicon layer has the disadvantage that a picture quality is deteriorated, since the threshold voltage of the transistor drifts when current in one direction is flown in a transistor for a long time. Further, as the mobility of a transistor which is produced in an amorphous silicon layer is small, the current with high speed response must be small. Further, as a P-channel is difficult, even a small size of CMOS circuit is impossible in an amorphous silicon layer.

Accordingly, it is preferable to use a poly-crystalline silicon semiconductor layer for an active matrix type organic EL display panel, since relatively large area of panel is possible, with high reliability and high mobility, and CMOS circuit is possible.

A TFT transistor produced in a prior poly-crystalline silicon layer has the disadvantage that trap level density depends upon a number of crystal boundaries in a channel, and that change of the trap level density affects the characteristics of the transistor. Therefore, when the channel length, and/or the channel width of a transistor is close to crystal grain diameter, the variation of a number of grain boundary in a channel is large. This causes the increase of variation of trap level density in a channel, and increase of variation of characteristics of a TFT transistor. The increase of the variation of the characteristics of a TFT transistor deteriorates of picture quality of a display panel.

Another disadvantage of a prior EL display panel concerns that light is obtained through a transparent electrode on a substrate. The reason of that is described in Japanese patent laid open publication 234683/1996, paragraph [0011] that (1) a non-transparent metal such as MgAg alloy which has work function less than 4 eV must be used in an anode electrode of an organic EL element, (2) the patterning of that metal is difficult, and (3) an organic thin film for a light emit layer and/or a transportation layer of a carrier is damaged and layers are separated in a photo-resist process using organic solvent.

Because of the above reasons, the separation of pixels in an organic display panel is carried out by patterning a transparent cathode electrode which is produced before an organic layer is produced, so that light is obtained through a substrate. Further, a non-transparent element, including a TFT transistor, a capacitor, and/or a lead line, prevents light, therefore, those elements are produced outside of an organic EL element.

FIG. 10A shows a pixel of an active matrix type organic EL panel, comprising a switching TFT transistor 304, a bias TFT transistor 305, an organic EL element 306, and a signal hold capacitor 307.

The light intensity emitted by a pixel depends upon area ($\alpha$) of a pixel. It is assumed that a pixel of a passive type organic EL element 406 has the area ($\alpha$) as shown in FIG. 10B. In an active matrix type organic EL element, the area for light emission is the area ($\beta$) which is the area of an organic EL element 306, and ($\beta$)<($\alpha$).

When there is no switching transistor 304, no bias transistor 305, and no capacitor 307, FIG. 10A coincides with FIG. 10B.

It is assumed that the light intensity for each unit area in FIG. 10B is A, and the light intensity for each unit area by an organic EL element 306 in FIG. 10A is B.

When the total intensity of a pixel in FIG. 10A is equal to that in FIG. 10B, the following relations are obtained.

($\beta$)B=($\alpha$)A

B=($\alpha/\beta$)A

An active matrix type organic EL element must have higher light intensity for each unit area of an organic EL element 306 if the same light intensity as that of the passive EL element 406 is desired, because of the presence of a switching TFT transistor 304, a bias TFT transistor 305 and a signal hold capacitor 307.

In other words, the components in a pixel decreases the ratio of area of an organic EL element in a pixel, and therefore, an organic EL element must have higher light intensity in order to compensate said decrease.

The increase of light intensity must follow the increase of current in an organic EL element, however, large current in an organic EL element is undesirable because large current shortens the lifetime and decreases operational reliability of an organic EL element.

SUMMARY OF THE INVENTION

It is an object of the present invention to provide a new and improved image display system by overcoming the disadvantages and limitations of a prior image display system.

It is an object of the present invention to provide an image display system which provides uniform light intensity on a whole panel with less variation of light intensity.

It is also an object of the present invention to provide an image display system which can omit a capacitor for keeping data to be displayed in a pixel.

The above and other objects are attained by an image display system having a plurality of thin film image display elements for light emission, each of said display elements being cyclically energized by a D.C. power source sequentially, comprising; a bias thin film transistor coupled between an image display element and a D.C. power source for flowing current into said image display element according to image data to be displayed; said transistor having a source, a drain and a gate, being formed on a substrate having an active layer; an active layer of said bias thin film transistor being formed by poly-crystalline silicon; length and width of a gate in said active layer of said bias thin film transistor being at least 10 times as large as average diameter of crystal grain of poly-crystalline silicon which forms said active layer.

Preferably, gate capacitance of said bias thin film transistor is large enough for keeping gate voltage until energization of the transistor in next cycle.

BRIEF DESCRIPTION OF THE DRAWINGS

The foregoing and other objects of the present invention will be appreciated as the same become better understood by means of the following description and accompanying drawings wherein.

DESCRIPTION OF THE PREFERRED EMBODIMENTS

Figure 1:
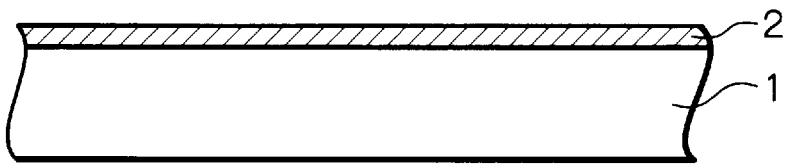
FIGS. 1(A)–1(F) show a part of producing steps of a thin film transistor according to the present invention.
Figure 1:
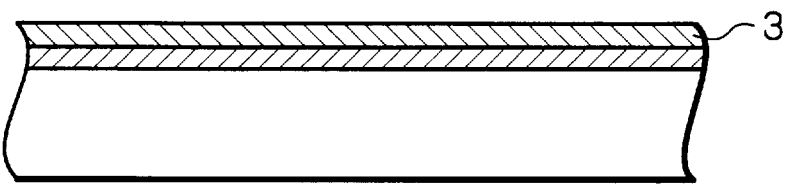
Figure 1:
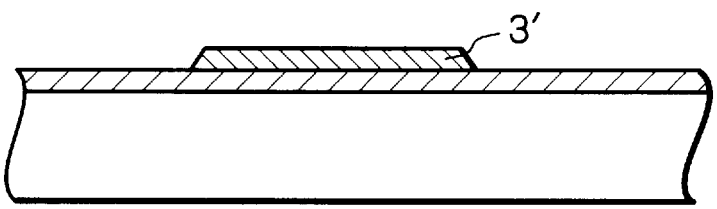
Figure 1:
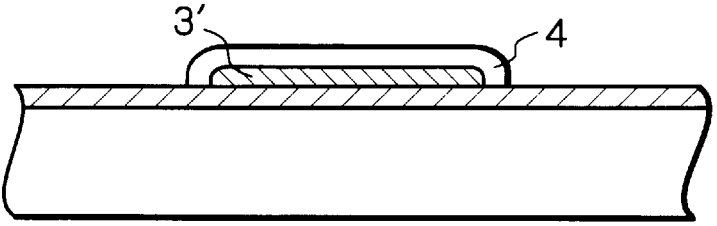
Figure 1:
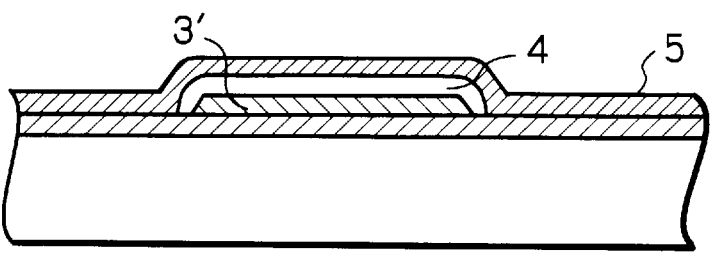
Figure 1:
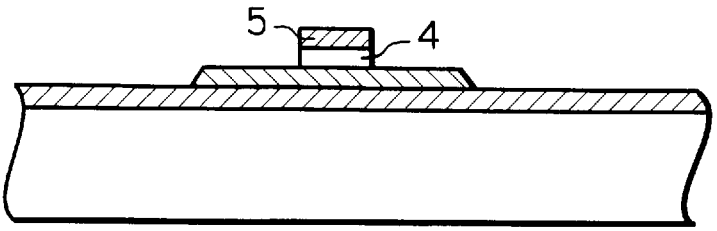
Figure 2:
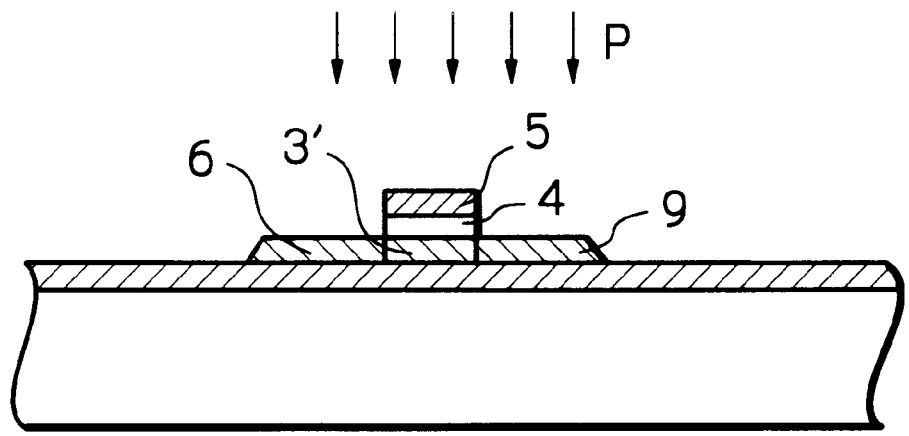
FIG. 2(A)–2(B) show rest of producing steps of a thin film transistor according to the present invention.
Figure 2:
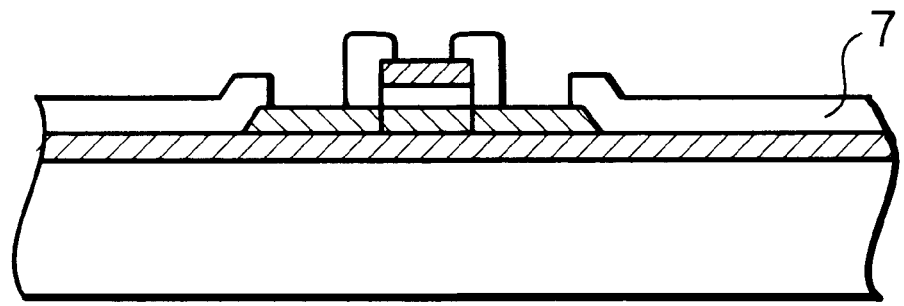

FIGS. 1 and 2 show the producing steps of a TFT (thin film transistor) for an image display panel, including a bias TFT transistor for flowing bias current in an organic EL element.

(1) A substrate 1 is made of quartz. An $SiO_2$ layer 2 is deposited on the substrate 1 by the thickness 1000 Å (FIG. 1A) through sputter process.

(2) On said $SiO_2$ layer 2, an amorphous silicon layer 3 is deposited by the thickness 1000 Å through LPCVD (low pressure CVD) process (FIG. 1B).

The operation condition in this step is as follows.

$Si_2H_6$ gas; 100–500 SCCM

He gas; 500 SCCM

Pressure; 0.1–1 Torr

Heating temperature; 430–500° C.

(3) The amorphous silicon layer 3 is converted to polycrystalline silicon (polysilicon) through solid phase growth.

The operation condition in this step is as follows.

$N_2$; 1 SLM

Temperature; 600° C.

Process hours; 5–20 hours

Then, temperature is raised to

Temperature; 850° C.

Process hours; 0.5–3 hours.

Then, an amorphous silicon layer 3 is converted to an active silicon layer.

(4) Next, a poly-crystalline silicon layer 3' produced in said step (3) is patterned to provide an island (FIG. 1C).

(5) A gate oxide layer 4 is deposited on a patterned poly-crystalline silicon layer 3' (FIG. 1D).

The operation condition for producing a gate oxide layer 4 is as follows.

$H_2$; 4 SLM $O_2$; 10 SLM

Temperature; 800° C.

Process hours; 5 hours (6) A silicon layer 5 is deposited on said gate oxide layer 4 through low pressure CVD process by the thickness 2500 Å (FIG. 1E).

The operation condition is as follows.

$SiH_4$ gas with 0.1% $PH_3$; 200 SCCM

Temperature; 640° C.

Process hours; 0.4 hour (7) A gate electrode 5 and a gate oxide layer 4 are shaped through an etching step for a predetermined pattern (FIG. 1F).

(8) A source region 6 and a drain region 9 are produced by doping phosphor into regions for a source and a drain with a mask by said gate electrode 5 through ion doping process so that a source region and a drain region are self-aligned (FIG. 2A).

(9) The substrate including those elements is processed in nitrogen atmosphere at 600° C. for 6 hours, and further, it is processed at 850° C. for 30 minutes to activate dopant.

(10) Then, an $SiO_2$ layer is deposited on the whole substrate as interlayer insulation layer 7 by the thickness 4000 Å with the start material TEOS.

The operation condition of said $SiO_2$ layer is as follows.
TEOS gas; 100 SCCM
Heating temperature; 700° C.

Alternatively, said $SiO_2$ layer is produced through plasma TEOS process as follows.
TEOS gas; 10–50 SCCM
$O_2$ gas; 500 SCCM
Power; 50–300 watts
Heating temperature; 600° C.

After said $SiO_2$ layer is produced, a patterning step is carried out according to a predetermined pattern for wiring for each electrodes, and inter-layer insulation layer 7 is produced (FIG. 2B).

(11) Next, thin metal film is deposited for an electrode (not shown), then, it is patterned. Thus, a thin film transistor TFT is produced.

(12) A thin film transistor thus produced is hydrogenated in hydrogen gas atmosphere at 350° C. for one hour, so that defect level density of a semiconductor layer is decreased.

When the size of an organic EL display panes is 4 inches in diagonal having 320 cells along a horizontal line and 240 cell along a vertical line, the area of each pixel is approximate 250 $\mu m^2$, and the size of a gate in that pixel is L=20 $\mu m$ and W=20 $\mu m$, or L=10 $\mu m$ and W=40 $\mu m$. A poly-crystalline silicon layer having the grain size 5–20 $\mu m$ which is suitable for that size of display panel can be produced by said steps.

When the length and the width of a gate of a bias TFT transistor is 10 times as large as the average diameter of a crystal grain, said TFT transistor is larger than a prior TFT transistor which is used in a prior image display panel, and therefore, the present TFT transistor has larger gate capacitance.

Accordingly, in the embodiment of the present invention, a TFT transistor is designed so that the size of the transistor is 10 times as large as the average diameter of a crystal grain of poly-crystalline silicon, and simultaneously, the transistor has the gate capacitance which is almost equal to the capacitance of a prior gate capacitor. Thus, a prior gate capacitor may be removed, and the ratio of area of an organic EL element occupying a pixel is increased. Thus, the operational reliability of a panel is improved.

Further, the organic EL element can occupy the area which is previously occupied by a capacitor. Therefore, the current in the organic EL element can be decreased as compared with that of a prior art, and an organic EL panel with longer life time is obtained.

Figure 3:
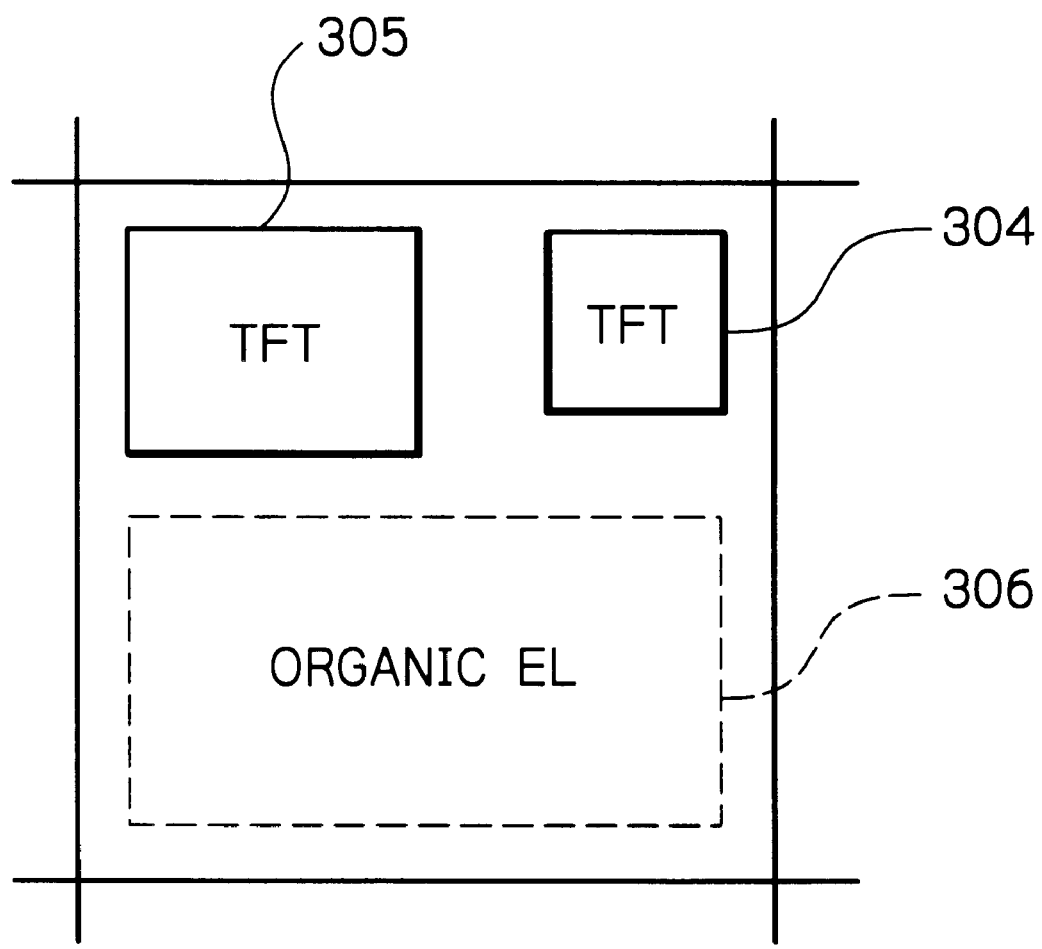
FIG. 3 shows structure of a pixel according to the present invention.
Figure 4:
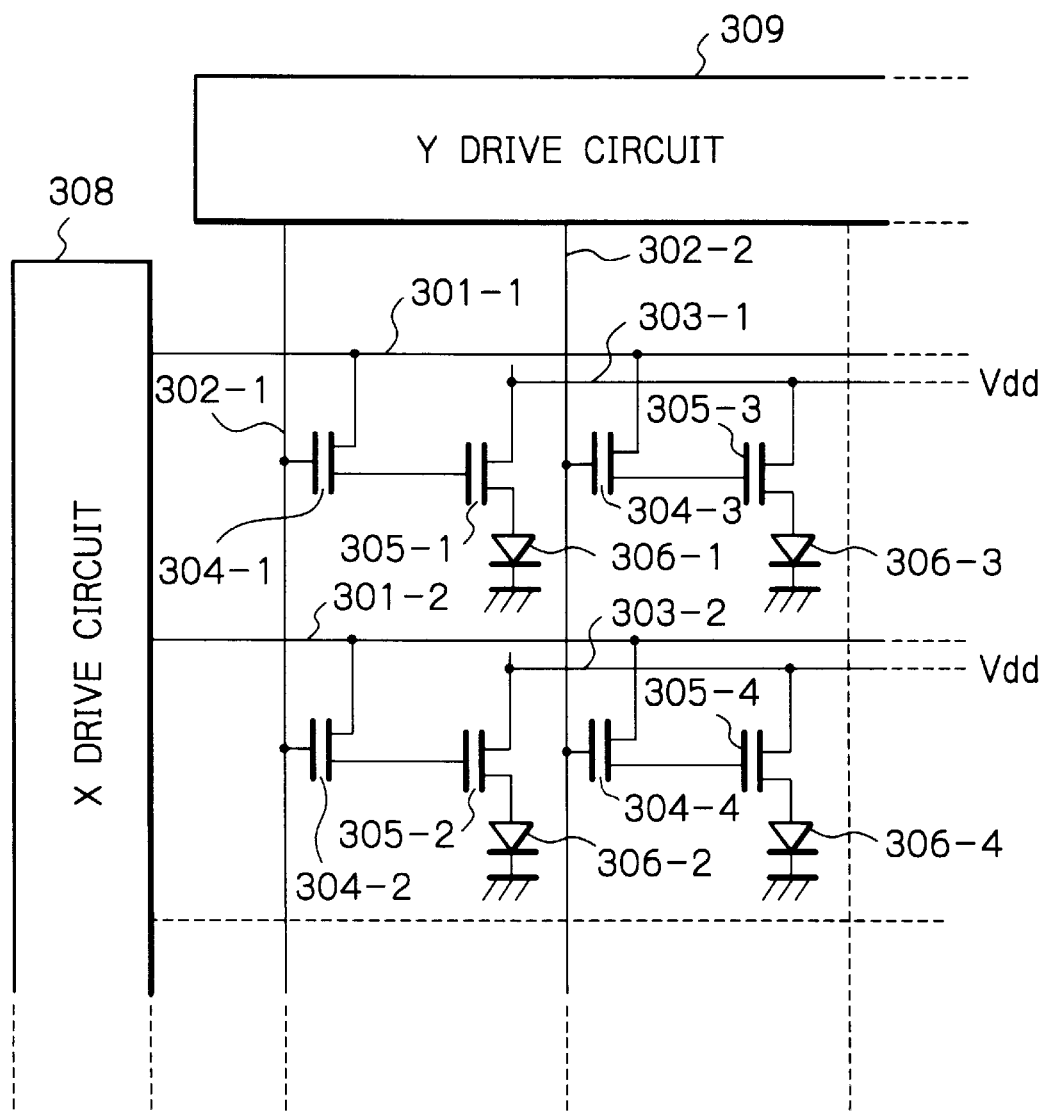
FIG. 4 shows a block diagram of a pixel according to the present invention.
Figure 9:
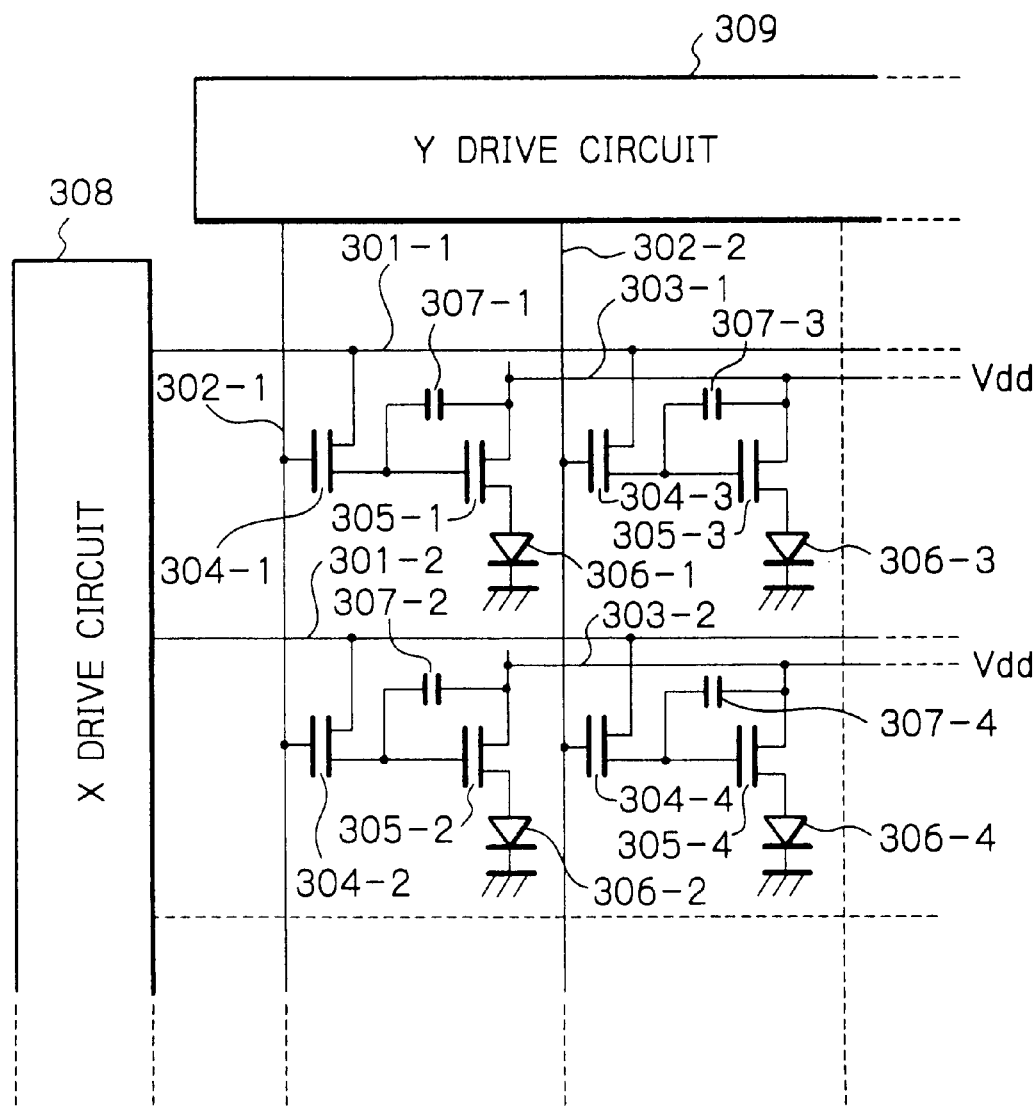
FIG. 9 is a block diagram of a prior pixel.
Figure 10A:
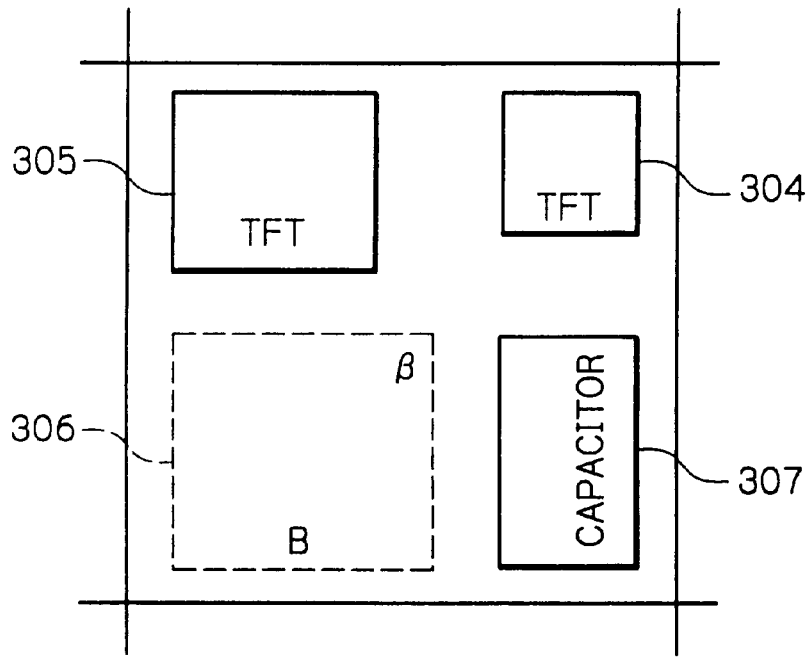
FIG. 10(A)–10(B) show structure of a prior pixel.
Figure 10B:
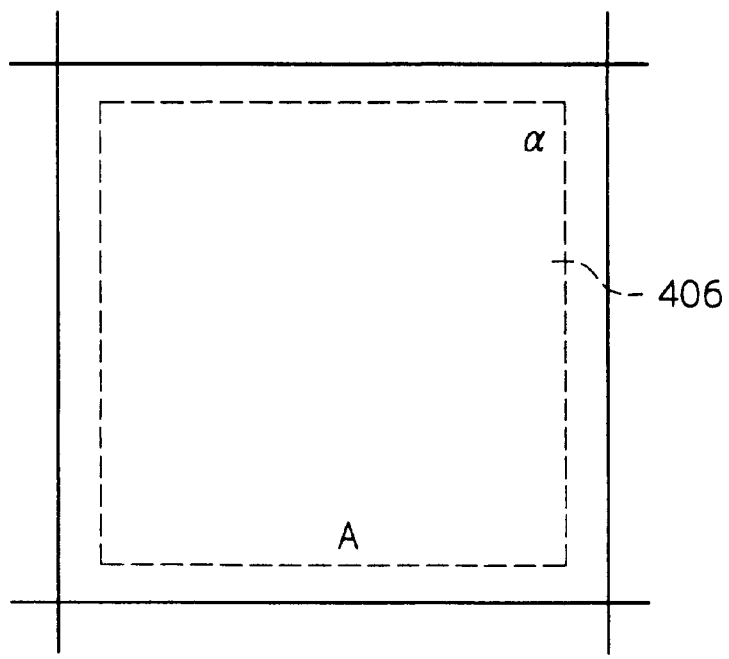

FIG. 3 shows that a larger EL element 306 as compared with that of a prior art can be used because of omission of a capacitor. Further, a display circuit is simplified as shown in FIG. 4, as compared with that in FIG. 9.

According to the present invention, many crystal boundaries exist in a channel so that the variation of a number of crystalline boundaries is suppressed, so that the variation of trap level density in a channel is suppressed, and the variation of the characteristics of a TFT transistor is suppressed.

The control of grain diameter of poly-crystalline silicon is described in IEEE Transaction On Electron Devices. Vol. 43, No.9, September 1996, pages 1399–1406 (in particular page 1401), which says that the grain diameter depends upon temperature and rate of growing film.

When the size L and W of a gate is 10 times as large as the average diameter of a crystal grain of poly-crystalline silicon, the variation of image intensity is sufficiently suppressed for 8 contrasts which is usually requested for data display.

When the display of 8 contrasts is carried out, noise level is requested to be less than $\frac{1}{10}$ of signal level (signal to noise ratio is 20 dB). The noise comes mainly from the variation of drain current caused by the variation of a TFT transistor in an active matrix type image display panel.

We found in the experiment that the ratio of the variation of drain current to average drain current is less than $\frac{1}{10}$ in usual bias condition in an active matrix type image display panel, when length L and width W of a gate of a TFT transistor are 10 times as large as average diameter of a crystal grain of poly-crystalline silicon of an active layer of a TFT transistor.

Figure 5:
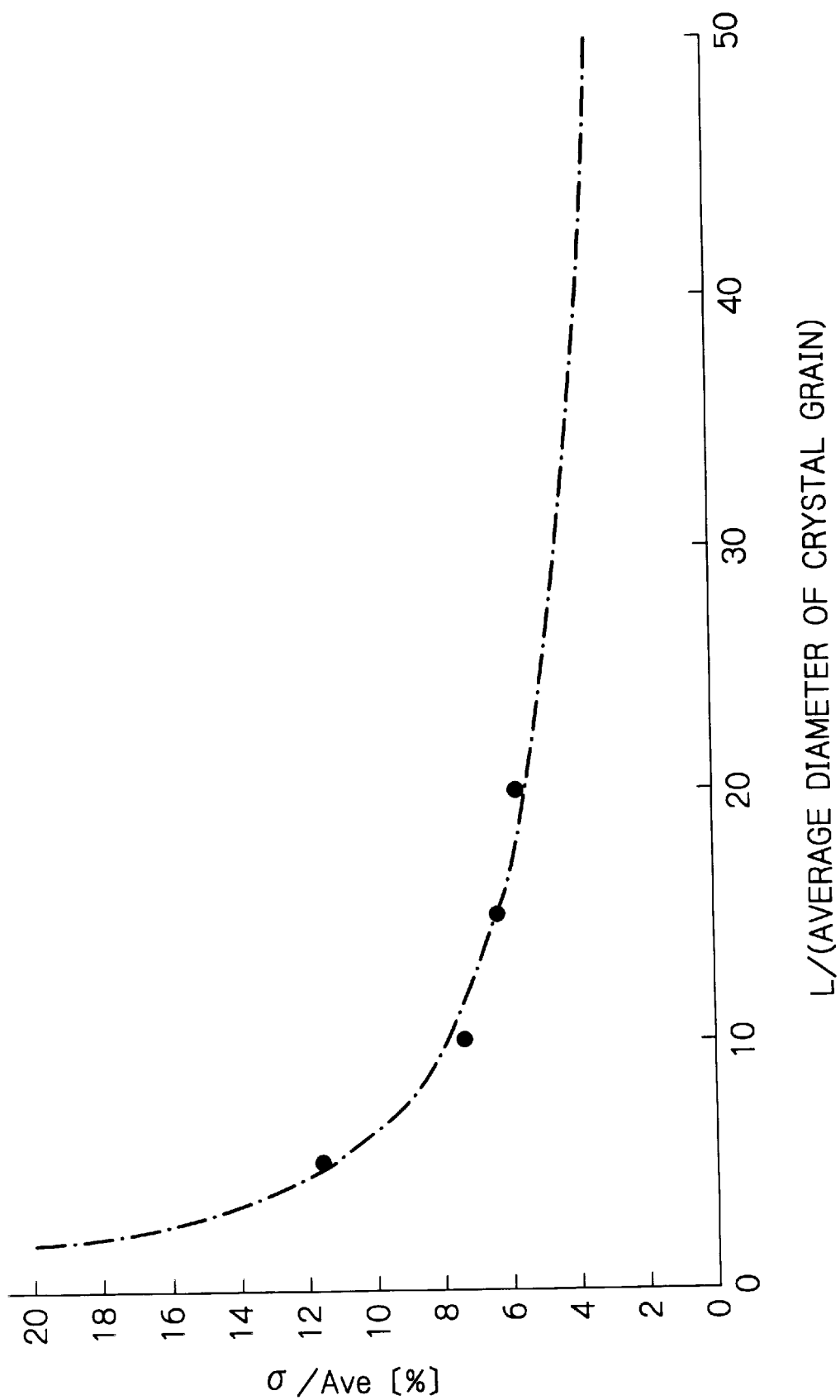
FIG. 5 shows an experimental curve between ratio of channel length L and average diameter of a crystal grain (horizontal axis), and ratio of variation of drain current and average drain current (vertical axis)

FIG. 5 shows the experimental curve in which the horizontal axis shows the ratio of the channel length L and the grain diameter of poly-crystalline silicon, and the vertical axis shows the ratio of the variation ($\sigma$) of drain current to average drain current (Ave). The threshold voltage of the TFT transistor is Vth=0.5 V, and the gate voltage is Vg=6 V. It should be appreciated in FIG. 5 that when the ratio of the channel length L to the average diameter of a crystal grain is larger than 10, the ratio of the variation ($\sigma$) of drain current to average drain current (Ave) is less than 8%. The larger the gate length and the gate width are, in other words, the larger the ratio shown in the horizontal axis is, the smaller said ratio is. However, the decrease of the variation in the vertical axis is small when the ratio in the horizontal axis is large. The similar result is observed in another gate voltage, for instance Vg=5 V.

When the size L and W is 50 times as large as the grain size of polysilicon of an active layer, the variation of intensity is almost not recognized.

Figure 6:
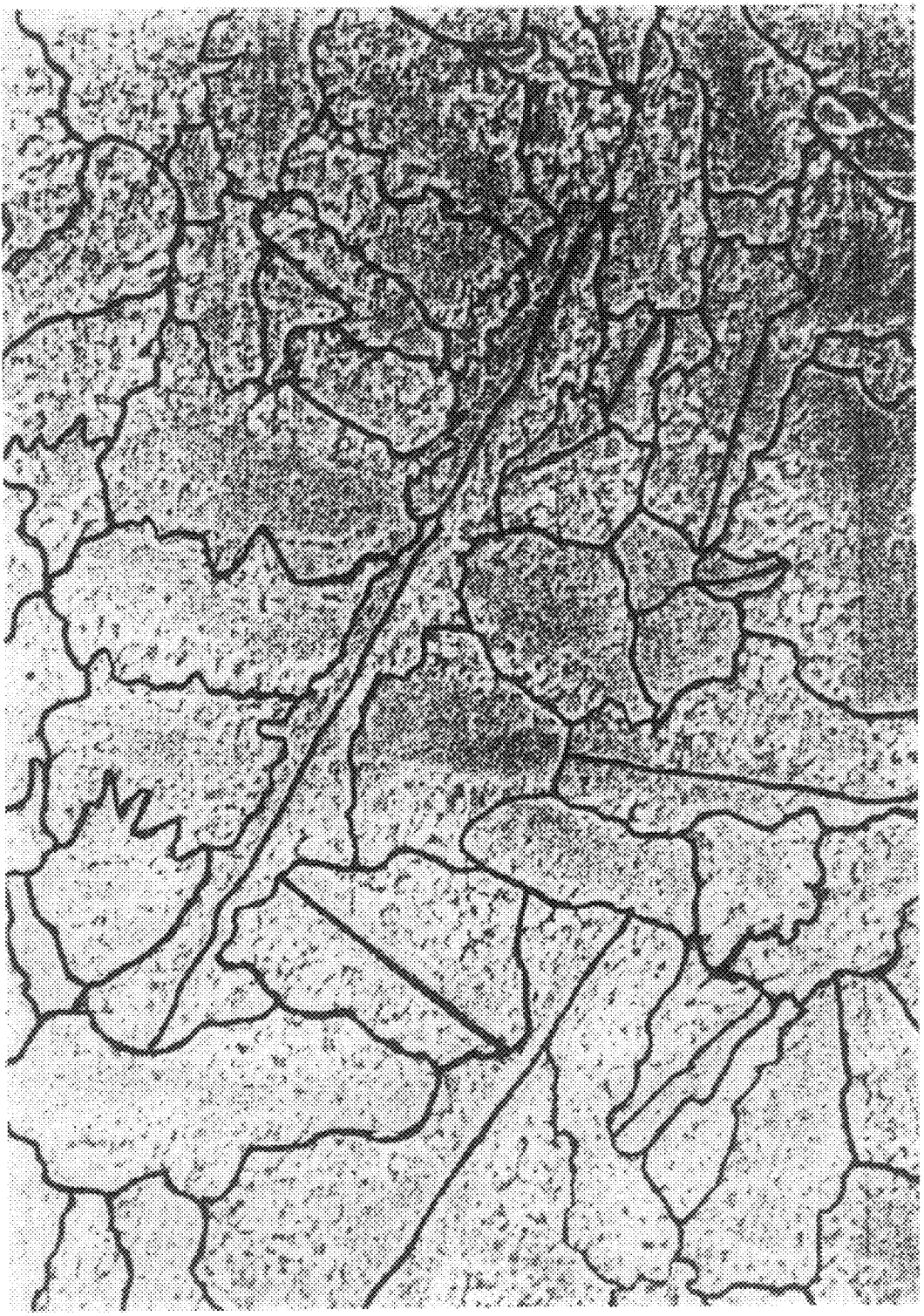
FIG. 6 is a scanning electron microscopic picture (SEM) of surface of a semiconductor, according to the present invention.
Figure 7A:
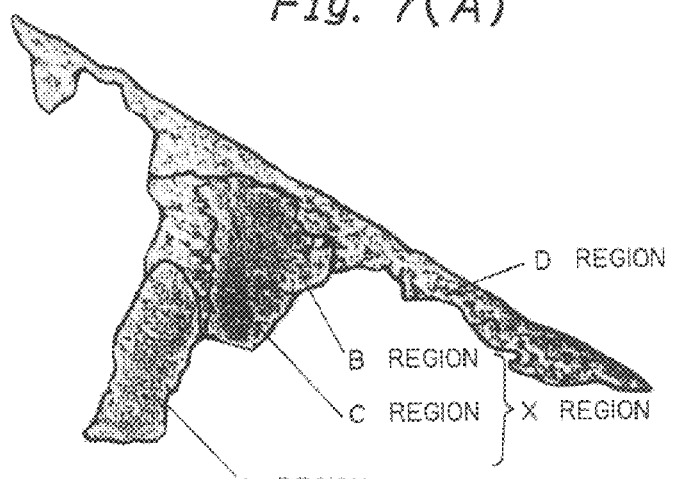
FIG. 7(A)–(B) show a part of a SEM picture for explanation of each grains.
Figure 7B:
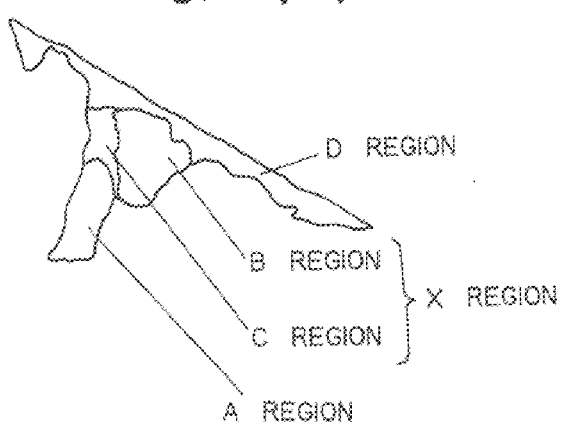
Figure 8:
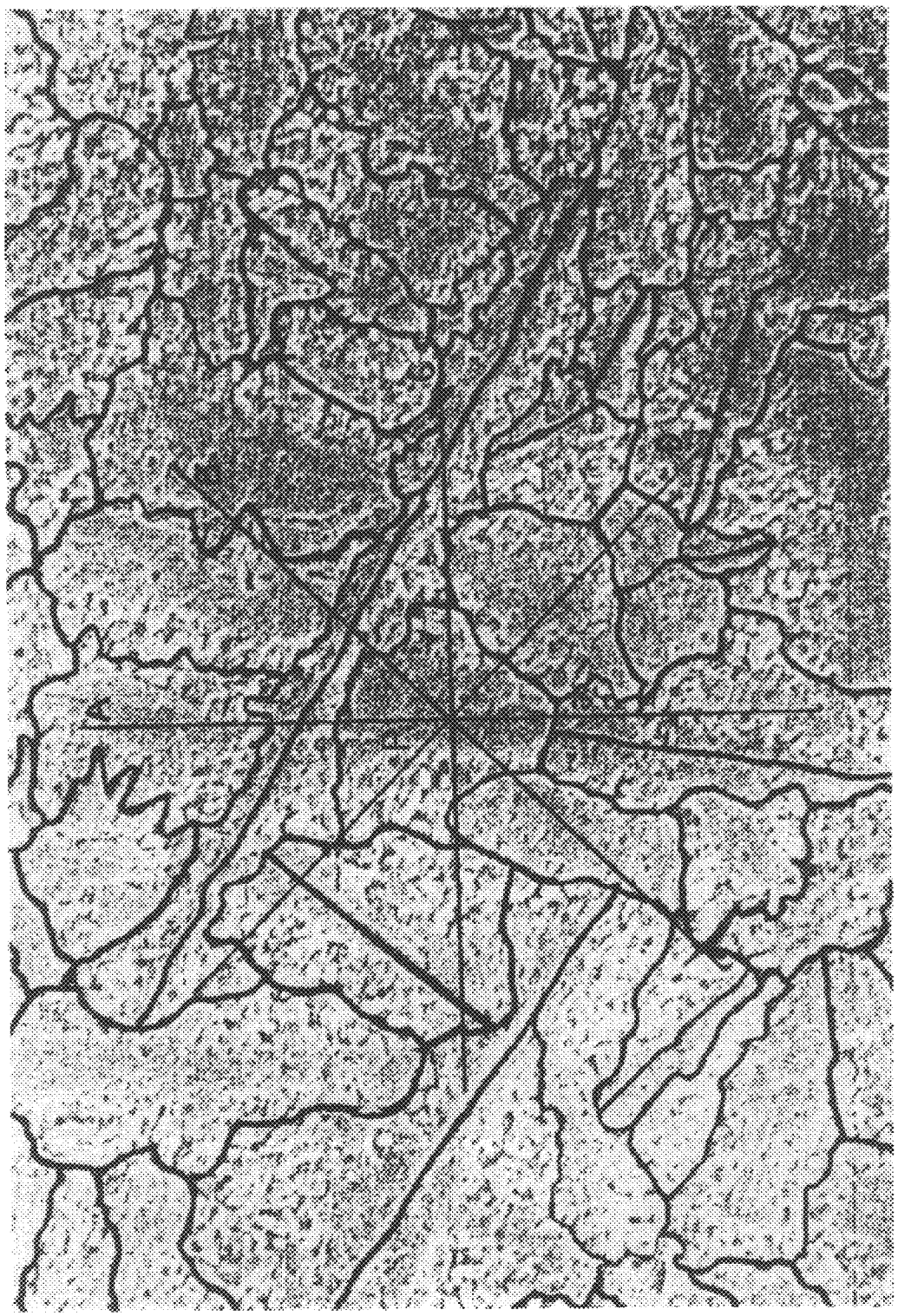
FIG. 8 is an explanatory figure for average diameter of a crystal grain.

Now, the definition of a crystal grain, and average diameter of the grain is described in accordance with FIGS. 6–8. FIG. 6 shows the enlarged semiconductor surface observed by using a scanning electron microscope (SEM), FIG. 7A is a partial view of FIG. 6, FIG. 7B is the explanatory view of FIG. 7A, and FIG. 8 is the explanatory view defining the average diameter of a crystal grain.

(1) First, a poly-crystalline substrate is etched through SECCO etching process by using etching solution of HF (49%) and $K_2Cr_2O_2$ (0.15 mol) with the ratio 1:2 for approximate 5 seconds, and then, a SEM picture of the substrate is taken. The picture is properly enlarged. The multiplying ratio of the picture must satisfy that a sufficient number of crystalline grains are in the field of view.

(2) By using the SEM picture, the grains are classified into a region A, B, C, D or X, as shown in FIG. 7A. The region A is defined so that it is an uniform continuous grain with no fine grain-like substance around the peripheral of the grain. The grain B is defined so that it is an uniform continuous grain with fine peripheral grain-like substance. The region C is defined so that it locates close to the region B with a band having fine grain-like substance between the regions B and C. The region X is the sum of the regions B and C. The region D is defined so that it is extremely elongated uniform continuous grain.

A crystal grain in the present invention is defined that it is one of said regions A, X(=B+C) and D. FIG. 7B shows the explanatory view of each regions A, X(=B+C) and D.

(3) Next, as shown in FIG. 8, a point P is defined in an enlarged microscopic picture. The point P may be any point in the picture. Four linear lines A, B, C and D each of which passes the point P, having angular interval of 45° with one another are drawn. The length of each linear lines is, in this embodiment, 2.4 $\mu$m. Then, a number of boundaries of the regions crossing said linear lines A, B, C and D are counted.

(4) The length of a crystal grain is defined so that it is the length between the boundaries along the linear line. And, the provisional average diameter of a crystal grain is defined so that it is the ratio of (the total sum of the length of crystal grains) and (a number of crystal grains) along each linear lines. In the embodiment of FIGS. 6–8, the provisional average diameter is shown in the following table.

TABLE 1

|        | Number of boundaries | Number of crystal grain | Provisional average diameter |
|--------|----------------------|-------------------------|------------------------------|
| Line A | 4                    | 2                       | 1.2 $\mu$m                   |
| Line B | 8                    | 4                       | 0.60 $\mu$m                  |
| Line C | 11                   | 5.5                     | 0.44 $\mu$m                  |
| Line D | 6                    | 3                       | 0.80 $\mu$m                  |

The provisional average diameter along the line A is 2.4 $\mu$m/2=1.2 $\mu$m, the provisional average diameter along the line B is 2.4 $\mu$m/4=0.6 $\mu$m, the provisional average diameter along the line C is 2.4 $\mu$m/5.5=0.44 $\mu$m, and the provisional average diameter along the line D is 2.4 $\mu$m/3=0.80 $\mu$m.

(5) Finally, the average of the provisional average diameter of each lines is calculated. This average is defined as the average diameter of a crystal grain of the subject layer. In the current embodiment, the average diameter is (1.2+0.60+0.44+0.80)/4=0.76. Therefore, the average diameter in the current embodiment is 0.76 $\mu$m.

The present invention has at least the following advantages.

(1) An active layer of a bias TFT transistor which energizes a thin film image element such as an organic EL element is comprised of poly-crystalline silicon, and the length and the width of a gate of the transistor is longer than 10 times of the average diameter of a crystal grain which forms said active layer. Therefore, the variation of light intensity of a panel is negligibly small.

(2) A bias TFT transistor has gate capacitance which is sufficient to keep the gate voltage until the image element is energized in next cycle. Therefore, a capacitor to keep data can be omitted, and the area of an organic EL element can be larger as the capacitor is omitted. Therefore, the light density of an organic EL element may be less, and the life time of an EL element may be longer.

From the foregoing, it will now be apparent that a new and improved image display system has been found. It should be understood of course that the embodiments disclosed are merely illustrative and are not intended to limit the scope of the invention. Reference should be made, therefore, to the appended claims to define the scope of the invention.

What is claimed is:

1. An image display system having a plurality of thin film image display elements for light emission, each of said display elements being cyclically energized by a D.C. power source sequentially, comprising;

a bias thin film transistor coupled between an image display element and a D.C. power source for flowing current into said image display element according to image data to be displayed, said transistor having a source, a drain and a gate, being formed on a substrate, an active layer of said bias thin film transistor being formed by poly-crystalline silicon located on said substrate, said gate located on said active layer length and width of said gate on said active layer of said bias thin film transistor being at least 10 times as large as average diameter of crystal grain of poly-crystalline silicon which forms said active layer thereby increasing gate capacitance wherein said gate capacitance of said bias thin film transistor holds a gate voltage until energization of the transistor in next cycle eliminating the need for a gate capacitor; and an organic element expanded in size taking the space previously occupied by said gate capacitor which will result in improved operational reliability.

2. An image display system according to claim 1, wherein said average diameter of a crystal grain is defined to be an average of provisional average diameter of grain boundaries along a plurality of lines having equal angular intervals on a SEC picture.

3. An image display system according to claim 2, wherein a number of said lines is 4, and angular interval between each lines is 45° on a SEC picture.

4. An image display system according to claim 1, wherein said display element and said bias thin film transistor are deposited on a common substrate.

* * * * *

UNITED STATES PATENT AND TRADEMARK OFFICE
CERTIFICATE OF CORRECTION

PATENT NO.    : 6,348,702 B1
DATED         : February 19, 2002
INVENTOR(S)   : Takayama et al.

It is certified that error appears in the above-identified patent and that said Letters Patent is hereby corrected as shown below:

<u>Title page,</u>
Item [73], please change the Assignee as follows:
"Semiconductor Energy Lab Co., Ltd. of Atsugi, Japan" to
-- Semiconductor Energy Laboratory Co., Ltd. of Kanagawa, Japan --

Signed and Sealed this

Twenty-third Day of July, 2002

*Attest:*

*Attesting Officer*

JAMES E. ROGAN
*Director of the United States Patent and Trademark Office*